(12) United States Patent
Herse

(10) Patent No.: US 8,537,559 B2
(45) Date of Patent: Sep. 17, 2013

(54) COMPLIANT INSERT FOR ELECTRONICS ASSEMBLIES

(75) Inventor: Nate B. Herse, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 386 days.

(21) Appl. No.: 13/014,367

(22) Filed: Jan. 26, 2011

(65) Prior Publication Data

US 2012/0188728 A1   Jul. 26, 2012

(51) Int. Cl.
*H05K 1/18* (2006.01)
(52) U.S. Cl.
USPC ............ 361/748; 174/260; 269/50; 269/296; 439/66; 439/71; 439/91; 29/868
(58) Field of Classification Search
USPC .................. 361/748; 174/260; 269/50, 296; 439/66, 71, 91; 29/860, 868
See application file for complete search history.

(56) References Cited

U.S. PATENT DOCUMENTS

| 5,037,312 A * | 8/1991 | Casciotti et al. ................. 439/66 |
| 2005/0020100 A1 * | 1/2005 | McGrath et al. ................. 439/71 |
| 2007/0119617 A1 * | 5/2007 | Hayashi et al. ................ 174/260 |

* cited by examiner

*Primary Examiner* — Xiaoliang Chen
(74) *Attorney, Agent, or Firm* — Eric A. Gifford

(57) ABSTRACT

A compliant insert is provided to support electronic assemblies to mitigate the effects of external loading. The insert comprises a polymer material having a durometer of between 10 and 90 on the Shore A scale and a 3-D negative relief on the surface of the polymer material. The 3-D negative relief is the negative of the 3-D positive relief of a specified geometric design of an electronics assembly. The compliant insert is mated with an instance of the electronics assembly such that the 3-D negative relief of the polymer material engages the 3-D positive relief of the assembly's PCB and electronic components. The polymer material is compliant enough to absorb the vertical and lateral spacing tolerances of the electronic components and stiff enough to mitigate deflections under loading.

12 Claims, 10 Drawing Sheets

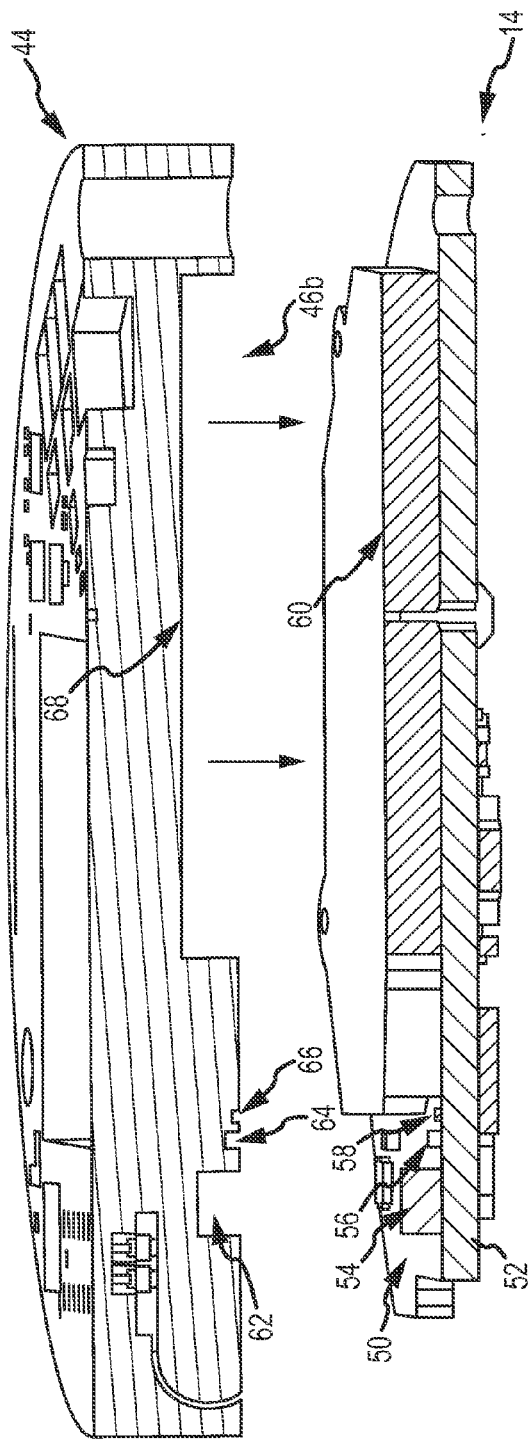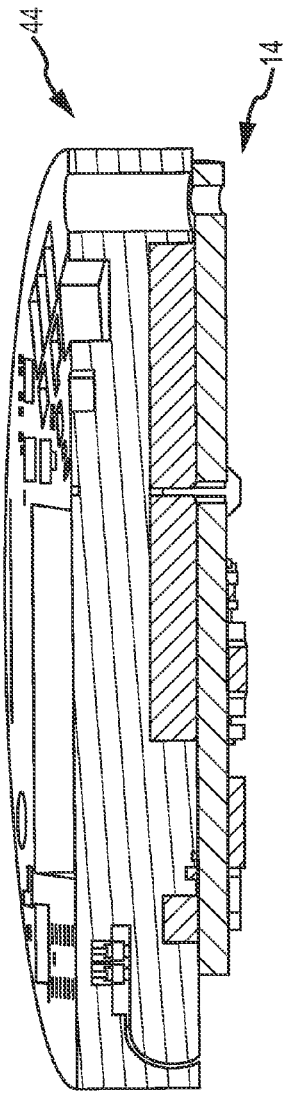
FIG.3a
FIG.3b

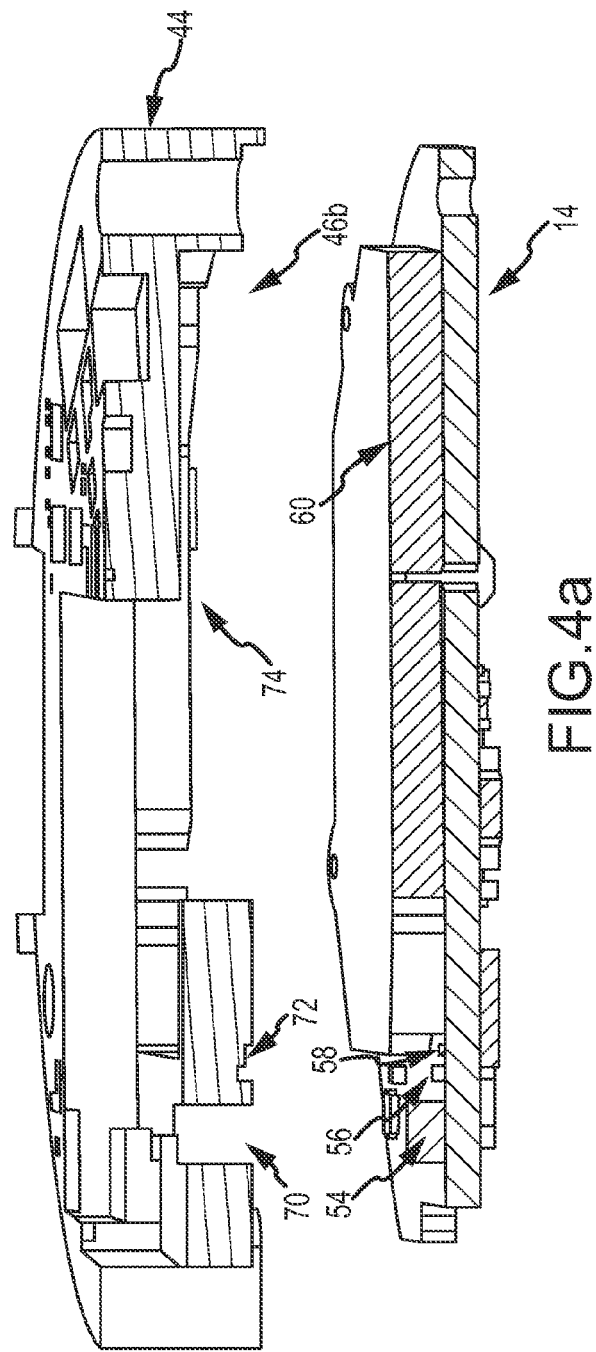
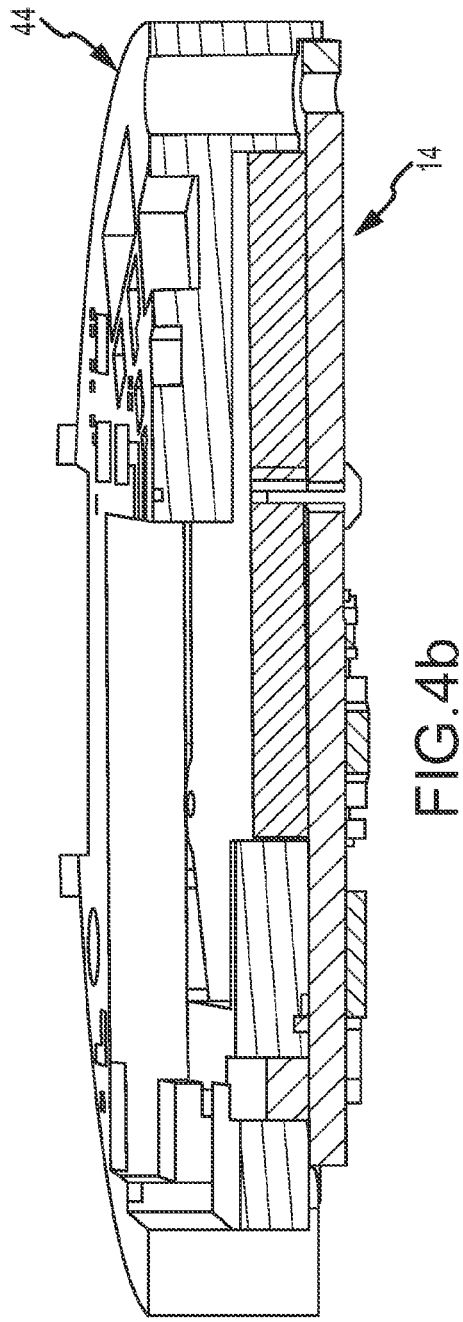
FIG.4a
FIG.4b

COMPLIANT INSERT FOR ELECTRONICS ASSEMBLIES

BACKGROUND OF THE INVENTION

1. Field of the Invention

This invention relates to packaging electronics assemblies to withstand external loads such as shock, vibration or temperature cycling. These external loads deflect the printed circuit boards (PCBs) or heavier electronic components stressing the solder connections causing them to weaken or break.

2. Description of the Related Art

An electronic assembly includes electronic components that are mounted on the surface of a printed circuit board (PCB) and electrically connected via solder connections. The electronic components may include all types of surface mount and through-holes components or integrated circuit (IC) chips. The PCB is a non-conductive substrate that provides a mechanical carrier to support the layout of the electronic components. The electronic components and solder connections may be mounted on either or both sides of the PCB.

In certain products and applications, electronic assemblies must withstand and operate in extremely challenging environments including but not limited to random transport vibration, extreme shock from explosions, dropping etc. and extreme temperature cycling over a multi-year product life. These externals loads cause the PCB to flex and apply high forces to heavier components. This in turn stresses the solder connections causing them to weaken or break.

The electronic assemblies may be "encapsulated" to mitigate the effects of these external loads. In a typical process, a stack of electronic assemblies are assembled to a lid using rigid standoffs and bolts. The stack is then inserted into a housing and the lid is secured. The lid and other through-housing connectors are sealed. Encapsulant material is injected into the housing and cured so that it bonds to the PCBs and electronic components. As the potting material is cured "in-situ" it forms a matched pair to each electronic assembly that absorbs any variations in geometry due to manufacturing tolerances. The cured material supports the PCBs and electronic components to minimize deflection and the resulting stress on the solder connections in response to external loading.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides a technique for supporting electronic assemblies to mitigate the effects of external loading. This technique is simple and inexpensive and allows for disassembly of the package to rework the electronic assemblies if needed. The support may be tailored for individual assemblies, PCBs or electronic components.

This is accomplished with a compliant insert comprising a polymer material having a durometer of between 10 and 90 on the Shore A scale and a 3-D negative relief on the surface of the polymer material. The 3-D negative relief is the negative of the 3-D positive relief of a specified geometric design of an electronics assembly. The compliant insert is designed and manufactured based on the "design" of an electronics assembly and thus may be used with any instance of the electronics assembly that is manufactured to the specified tolerances. The compliant insert is mated with an instance of the electronics assembly such that the 3-D negative relief of the polymer material engages the 3-D positive relief of the assembly's PCB and electronic components. The package may be "preloaded" to eliminate undesirable air gaps. The insert may be constructed to vary the support and amount of pre-loading provided to different components or different areas of the PCB. The polymer material is compliant enough to absorb the vertical and lateral spacing tolerances of the electronic components and stiff enough to mitigate deflections under loading. The insert may be constructed with 3-D negative relief on both surfaces to mate with and support electronics assemblies to both sides. The insert may be constructed with other features such as air channels or conductors for thermal management. Because the insert is not bonded to the electronics assembly, the package may be disassembled, the electronics assembly reworked if necessary and the package reassembled.

In an embodiment, one or more electronics assemblies and one or more compliant inserts are stacked in a housing in an alternating manner. Each electronics assembly comprises a plurality of electronic components mounted on a least one of a top and bottom surface of a printed circuit board (PCB) that provides a 3-D positive relief. In each assembly at least a height of the components off the PCB varies within a tolerance with respect to a specified geometric design of that electronics assembly. Each compliant insert comprises polymer material having a durometer of between 10 and 90 on the Shore A scale and a 3-D negative relief of the specified geometric design of the adjacent electronic assembly on at least one of a top and bottom surface of the polymer material to engage the 3-D positive relief of the electronic assembly either above or below the compliant insert. A lid is placed on the housing, which may or may not be sealed. The stack is preloaded so that the one or more compliant inserts engage the PCBs and electronic components of the one or more electronics assemblies. Should it become necessary, the housing may be disassembled to rework one or more of the electronic assemblies and then reassembled.

These and other features and advantages of the invention will be apparent to those skilled in the art from the following detailed description of preferred embodiments, taken together with the accompanying drawings, in which:

BRIEF DESCRIPTION OF THE DRAWINGS

FIGS. 3a and 3b are exploded and mated sections of isometric views of a first embodiment of compliant insert and electronics assembly;

FIGS. 4a and 4b are exploded and mated sections of isometric views of a second embodiment compliant insert and electronics assembly;

DETAILED DESCRIPTION OF THE INVENTION

The present invention describes a technique for supporting electronic assemblies to mitigate the effects of external loading. This technique is simple and inexpensive and allows for disassembly of the package to rework the electronic assemblies if needed. The support may be tailored for individual assemblies, PCBs or electronic components.

Figure 1:
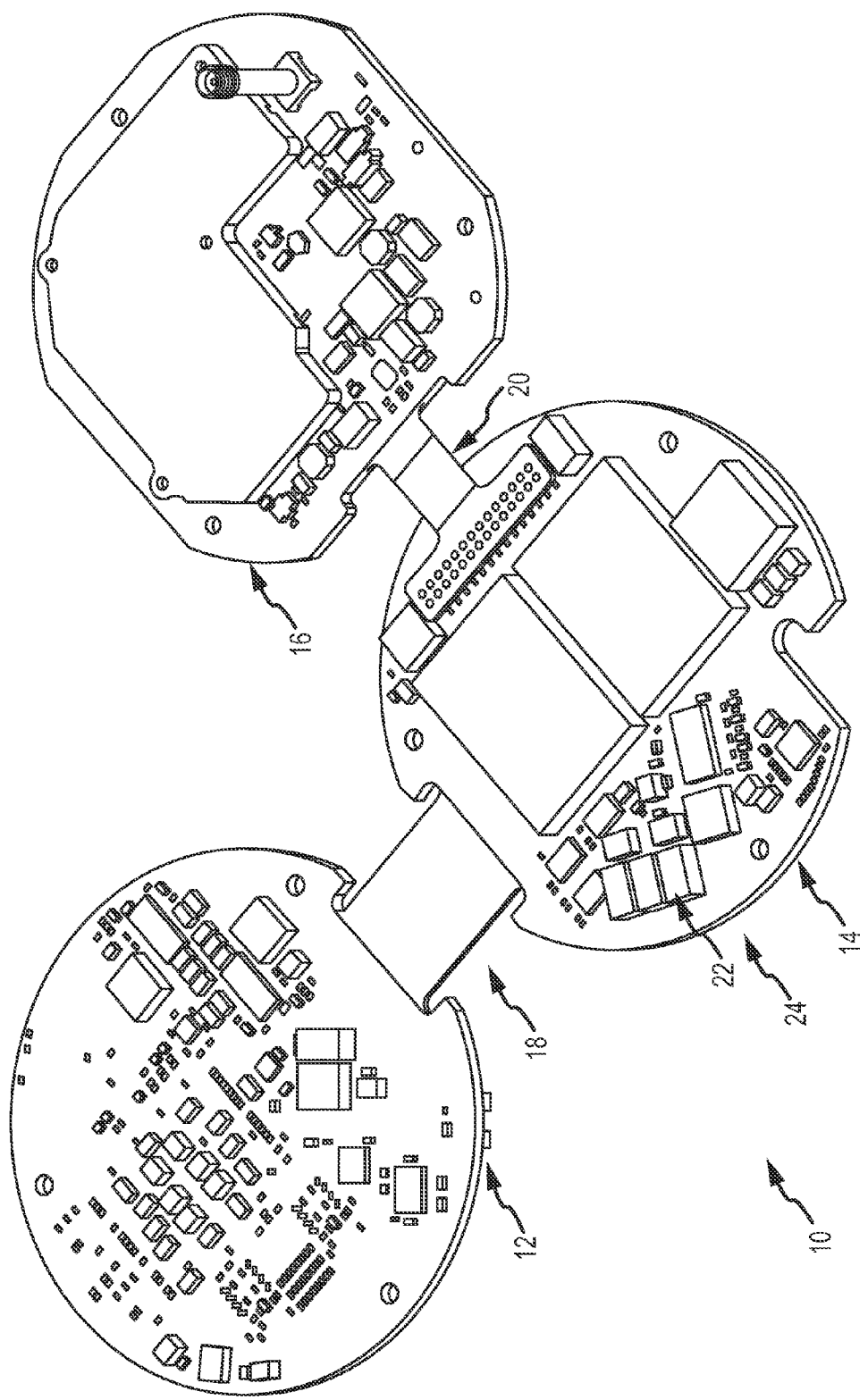
FIG. 1 is a diagram is a drawing of three stackable electronics assemblies, each assembly including electronics components on a printed circuit board (PCB)

As shown in FIG. 1, an exemplary electronics package 10 includes three electronics assemblies 12, 14 and 16. Assemblies 12 and 14 are electrically connected with an inter layer flexible printed circuit 18 and assemblies 14 and 16 are connected with an inter layer flexible printed circuit 20. Assemblies 12 and 16 are folded under and over assembly 16 to form a stack. Each assembly includes a plurality of electronic components 22 such as IC chips mounted on a PCB 24 in a particular layout.

Each electronics assembly is manufactured according to a specified geometric design for that assembly. The design the design specifies the PCB, the electronic components, the layout of the electronic components and the solder connections between the components. The design will specify the ideal height and lateral extent of each of the electronic components. The overall specification will further specify tolerances, height and lateral extent, for placement of the electronic components. These tolerances may be uniform or vary with component. A typical tolerance may be plus or minus five one-thousandths of an inch. Each instance of a manufactured electronics assembly will not match the specified geometric design perfectly but should satisfy the specified tolerances.

The present invention provides a compliant insert that is constructed for a specified geometric design of an electronics assembly for use with any manufactured instance of that electronics assembly that satisfies the specified tolerances. The compliant insert has a 3-D negative relief that mirrors the 3-D positive relief of the specified geometric design. The insert may be one or two-sided, to mate with and support electronics assemblies both above and below the insert. The insert is both compliant enough to absorb the vertical and lateral spacing tolerances of the electronic components and stiff enough to mitigate deflections under loading. The insert is inexpensive to build, easy and quick to assemble and allows for disassembly and rework of the package. The insert's 3-D negative relief may be modified by removing or adding material to vary the amount of loading or support to individual components.

The compliant insert comprises a polymer material such as but not limited to silicone or urethane that provides a proper balance of both compliance and rigidity. Sufficient compliance is needed to absorb the variations in height and lateral extent of a manufactured instance of an electronics assembly. The insert is not matched to a particular instance but rather to the specified geometric design. As such a given insert can be used with any instance of that design. Sufficient rigidity is needed to support the PCB and electronic components to mitigate deflections induced by external loads. If the insert is too compliant it will not provide the requisite support. If the insert is too rigid it will not absorb the manufacturing tolerances and may serve to transfer, instead of dampen, external loads through the insert to other PCBs and components.

Hardness may be defined as a material's resistance to permanent indentation. Durometer is one of several measures of the hardness of a material. The durometer scale was defined by Albert F. Shore. There are several scales of durometer, used for materials with different properties. The "Shore A scale" is for softer plastics such as silicone or urethane. Durometer measures the depth of an indentation in the material created by a given force on a standardized pressure foot. This depth is dependent on the hardness of the material, its viscoelastic properties, the shape of the pressure foot, and the duration of the test. The basic test requires applying the force in a consistent manner, without shock, and measuring the hardness (depth of indentation). The ASTM D2240-00 testing standard defines the test for the Shore A scale as follows: Indenting foot of a hardened steel rod 1.1 mm-1.4 mm diameter with a truncated 35 cone, 0.79 mm diameter and an applied mass of 0.822 kg with a resulting force of 8.064 Newtons. If the indenter penetrates 2.54 mm (0.100 inch) or more, the durometer is 0. If the indenter does not penetrate at all, the durometer is 100. Durometer is a dimensionless quantity.

In the present invention, the insert comprises polymer material having a durometer of between 10 and 90 on the Shore A scale. In other embodiments, the durometer may be further specified as between 30 and 70 on the Shore A scale.

Figure 2A:
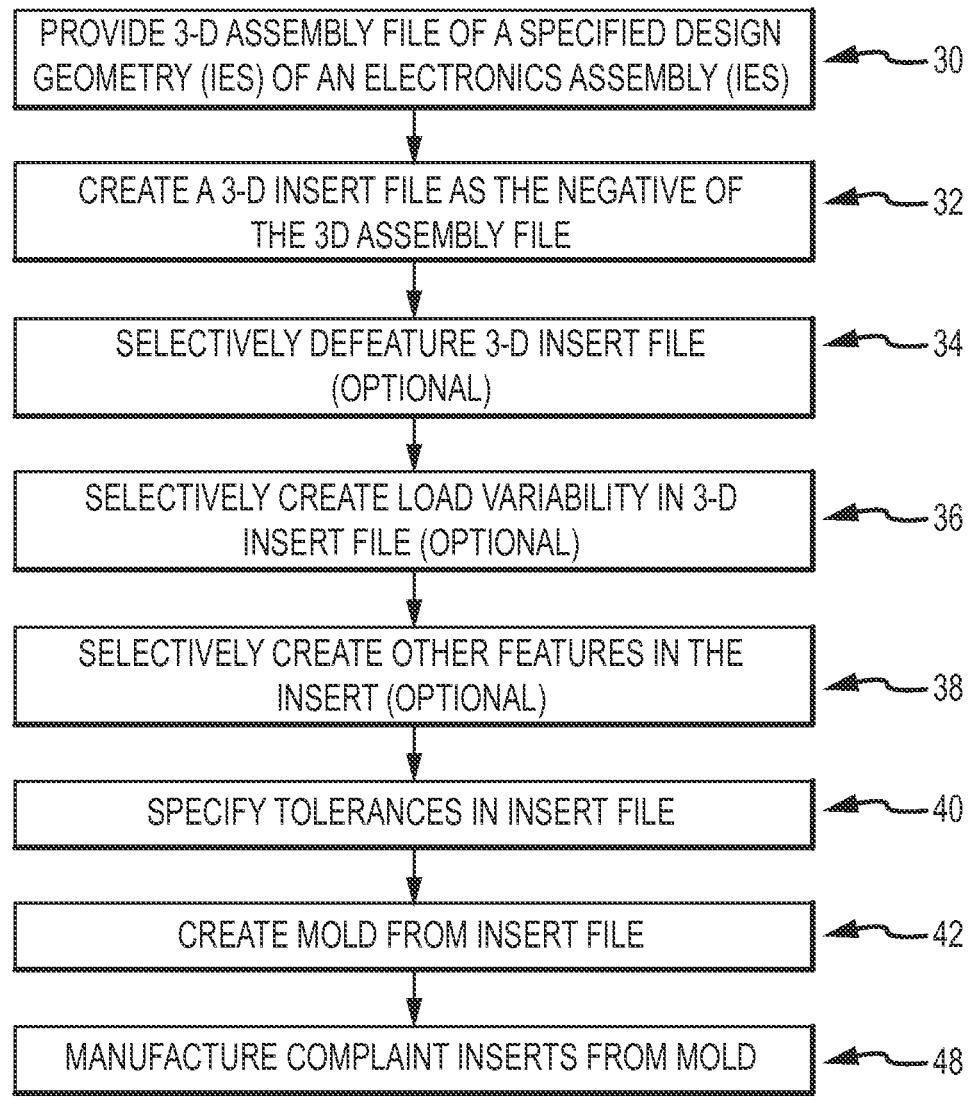
FIGS. 2a and 2b are a process flow diagram for the design and manufacture of a compliant insert for a specified geometric design of an electronics assembly and the manufactured insert.
Figure 2B:
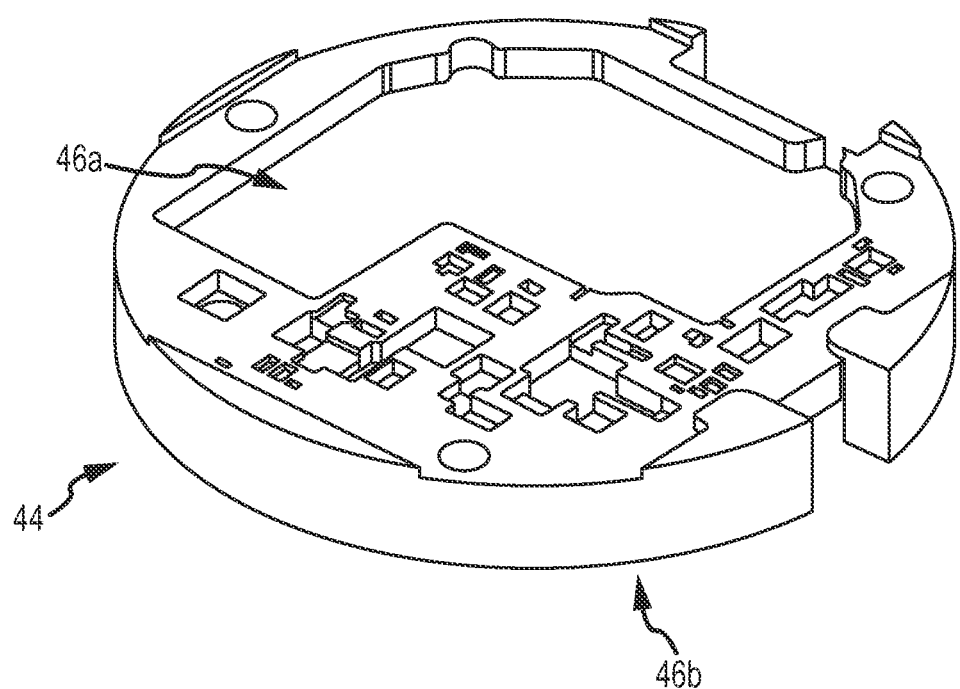

As shown in FIG. 2, an embodiment to design and manufacture compliant inserts comprises first providing a 3-D assembly file of the specified design geometry of an electronics assembly (step 30). The file defines the placement, lateral and extent and height of each of the components that define the 3-D positive relief for one side of the electronics assembly. If the compliant insert will be sandwiched between a pair of electronics assemblies than a pair of assembly files are provided. These files are typically computer generated. In this case, the assembly files define the 3-D positive relief for the top surface of electronic assembly 14 and the bottom surface of electronic assembly 16. Next, a computer generates a 3-D insert file as the negative of the 3D assembly file, generating only one insert file if the insert is double-sided (step 32). This file may define the 3-D negative relief of the compliant insert that would match the ideal nominal geometric design of the corresponding electronics assembly. The 3-D negative relief may be offset for "maximum material condition" i.e. the maximum positive deviation from nominal allowed for the components or the "least material condition" i.e. the maximum negative deviation from nominal. Either the nominal, maximum material condition or least material condition may be considered to be the specified geometric design.

The 3-D negative relief may be modified by adding or removing volume of polymer material from the insert for various purposes. Optionally, the 3-D negative relieve may be modified ("defeatured") to not engage either side or top surfaces of specified electronic components (step 34). This may be done because the features between components are so small as to be difficult to manufacture or because certain components do not require support. Defeaturing may simply pull back the insert outside the maximum tolerance deviation for the component or may remove material above or to the side of the component altogether. Optionally, the 3-D negative relieve may be modified to vary the amount of support or nominal preloading applied to different components (step 36). By adding a volume of material to extend the 3-D negative relief (vertically or laterally), the insert will engage the corresponding components a bit prematurely providing greater support or preloading. Conversely, by removing a volume of material to cut short the 3-D negative relief (vertically or laterally), the insert will engage the corresponding components a bit later thereby reducing the support or pre-loading. Optionally, the 3-D negative relief may be modified to create other features within the insert (step 38). For example, material volume may be removed to create an air channel in the insert. Such a channel may be used for thermal management. A thermally conductive part may be placed inside the air channel for thermal management.

Once the 3-D negative relief is set, manufacturing tolerances for the compliant insert are specified (step 40). These tolerances are typically smaller than the manufacturing tolerances on the placement of electronic components, perhaps one one-ten thousandth of an inch. The tolerance may be uniform across the compliant insert or may vary. The specified tolerance may be determined by such factors as the criticality of a particular component, the manufacturing tolerances for the assemblies or expected external loads.

The 3-D insert file(s) and specified tolerance(s) are then used to create a mold (step 42). The mold is then used to manufacture a quantity of compliant inserts 44 having a 3-D negative relief 46a and 46b on its top and bottom surfaces (step 48) that may be used with an instance of the electronics assemblies for which it was designed.

Without loss of generality we will now describe and illustrate variations of compliant insert 44, and particularly the 3-D negative relief 46b on its bottom surface. For simplicity, the instance of electronics assembly 14 that exhibits a 3-D positive relief 50 is depicted as a perfect replica of the nominal geometric design without any manufacturing variances. Electronics assembly 14 comprises a number of electronics components mounted on both sides of a PCB 52. In particular, electronic components 54, 56, 58 and 60 are mounted on the top surface of the PC, components 56 and 58 being positioned very close to each other.

As shown in FIGS. 3a and 3b, compliant insert 44 has been designed and manufactured without any of the optional modifications to its 3-D negative relief 46b. The inserts 3-D negative relief 46b has cutouts 62, 64, 66 and 68 that exactly match the nominal design geometry of the corresponding components. When the compliant insert is positioned over the electronics assembly as shown in FIG. 3b, the compliant insert engages the top and side surfaces of each of the components and the surface of the PCB.

In a real instance of a manufactured electronics assembly, both the height and lateral extent of the components will vary plus or minus within the specified tolerances. As such, when the compliant insert is positioned over the electronics assembly there will be either small air gaps or interferences between the insert and the PCB and possibly the surface of some components. Because the insert is compliant, it may be pre-loaded to absorb these tolerances and minimize or eliminate any air gaps. The insert may be preloaded by, for example, applying a uniform downward force across the surface of the insert. The insert can however be used without preloading, allowing for small deflections in areas of mismatch between the insert and the assembly.

As shown in FIGS. 4a and 4b, compliant insert 44 has been designed and manufactured by modifying ("defeaturing") its 3-D negative relief 46b to not engage either side or top surfaces of specified electronic components. The insert's 3-D negative relief 46b has a cut-out 70 that is registered to and provides lateral support to component 54 but has had volume removed above the component and thus does not provide vertical support to the component. The 3-D negative relief 46b has a single cutout 72 that is registered to and spans the 'envelope' of components 56 and 58. The insert provides both lateral and vertical support but does not provide support between the components. The 3-D negative relief 46b has a single cutout 74 that is registered to component 60 to provide lateral but not vertical support.

Figure 5A:
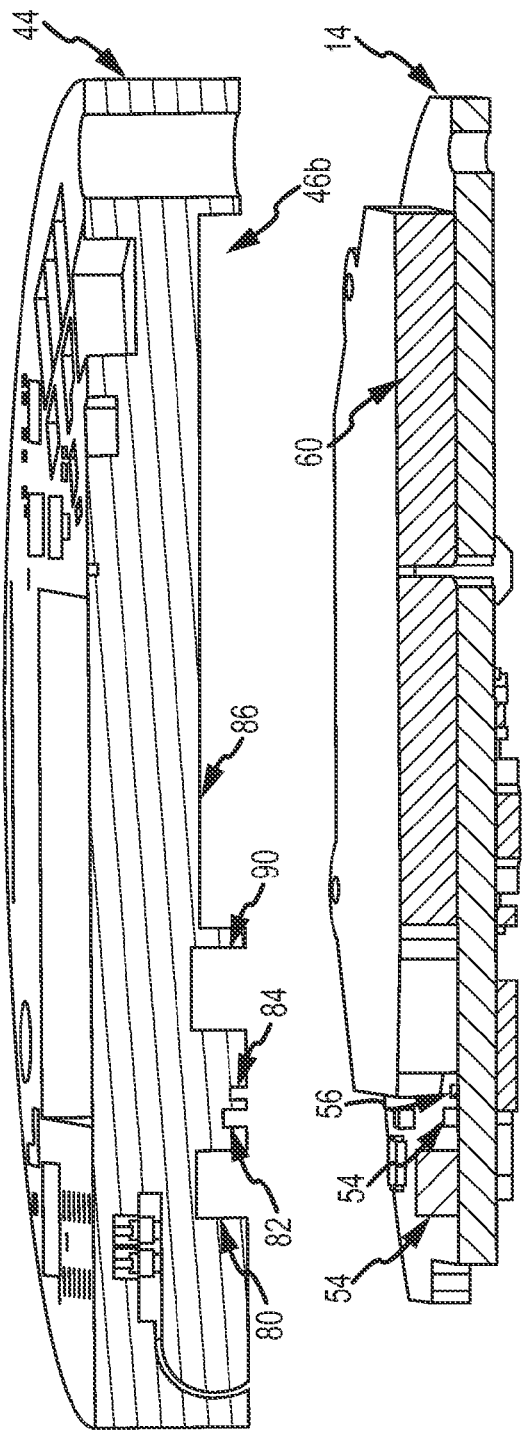
FIGS. 5a and 5b are exploded and mated sections of isometric views of a third embodiment compliant insert and electronics assembly.
Figure 5B:
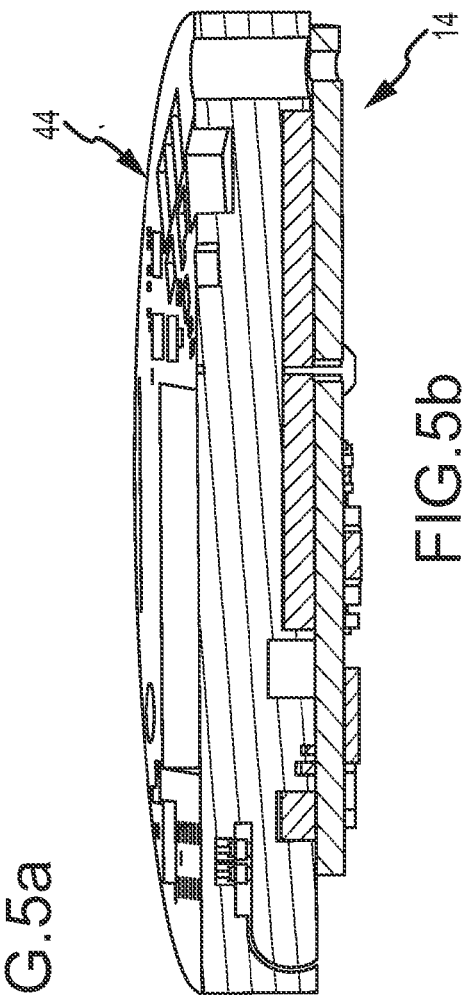

As shown in FIGS. 5a and 5b, compliant insert 44 has been designed and manufactured by modifying its 3-D negative relief 46b to vary the support or preload provided to certain components and to define other features within the insert. The 3-D negative relief 46b has a cutout 80 that is registered to component 54 to provide a nominal amount of preload and support. Assuming component 54 is nominally positioned and exhibits zero height variation, the insert will provide the nominal preload and support. The 3-D negative relief 46b has cutouts 82 and 84 that are registered to components 56 and 58, respectively, to provide less than the nominal preload. A small volume of material has been removed from the insert to increase the height of cutouts 82 and 84. Again assuming ideal components 56 and 58, the insert will not engage the top surface of the components when initially assembled, leaving a small air gap between the component and the insert. When the insert is pre-loaded, the insert will absorb this tolerance and load the component but the amount of pre-loading or force will be somewhat reduced. Conversely, the 3-D negative relief 46b has a cutout 86 that is registered to component 60 to provide greater than the nominal preload. A small volume of material has been added to the insert to reduce the height of cutout 86. Again assuming an ideal component 60, the insert will prematurely engage the top surface of the components when initially assembled producing a small load. When the insert is pre-loaded, the insert further load component 60 so that the net preloading will be somewhat elevated. For a specific instance of the electronics assembly, the position and height of the components will not be ideal and thus the actual preloading and support will vary but will be biased in the desired direction. As also shown in FIGS. 5a and 5b, compliant insert 44 has been designed and manufactured to include an air channel 90 to conduct heat away from the electronics assembly. A thermally conductive part may be placed in air channel 90 to further improve heat conduction. Because the insert is molded "ex-situ" these and other types of features may be formed therein.

An advantage of the compliant insert is the ease with which multiple electronics assemblies may be stacked and packaged and, if necessary, disassembled to rework any of the electronics assemblies. In general, one or more electronics assemblies and one or more compliant inserts are stacked in a housing in an alternating manner. Each electronics assembly comprises a plurality of electronic components mounted on a least one of a top and bottom surface of a printed circuit board (PCB) that provides a 3-D positive relief. In each assembly at least a height of the components off the PCB varies within a tolerance with respect to a specified geometric design of that electronics assembly. Each compliant insert comprises polymer material having a durometer of between 10 and 90 on the Shore A scale and a 3-D negative relief of the specified geometric design of the adjacent electronic assembly on at least one of a top and bottom surface of the polymer material to engage the 3-D positive relief of the electronic assembly either above or below the compliant insert. A lid is placed on the housing, which may or may not be sealed. The stack is preloaded so that the one or more compliant inserts engage the PCBs and electronic components of the one or more electronics assemblies. Should it become necessary, the housing may be disassembled to rework one or more of the electronic assemblies and then reassembled.

Figure 6:
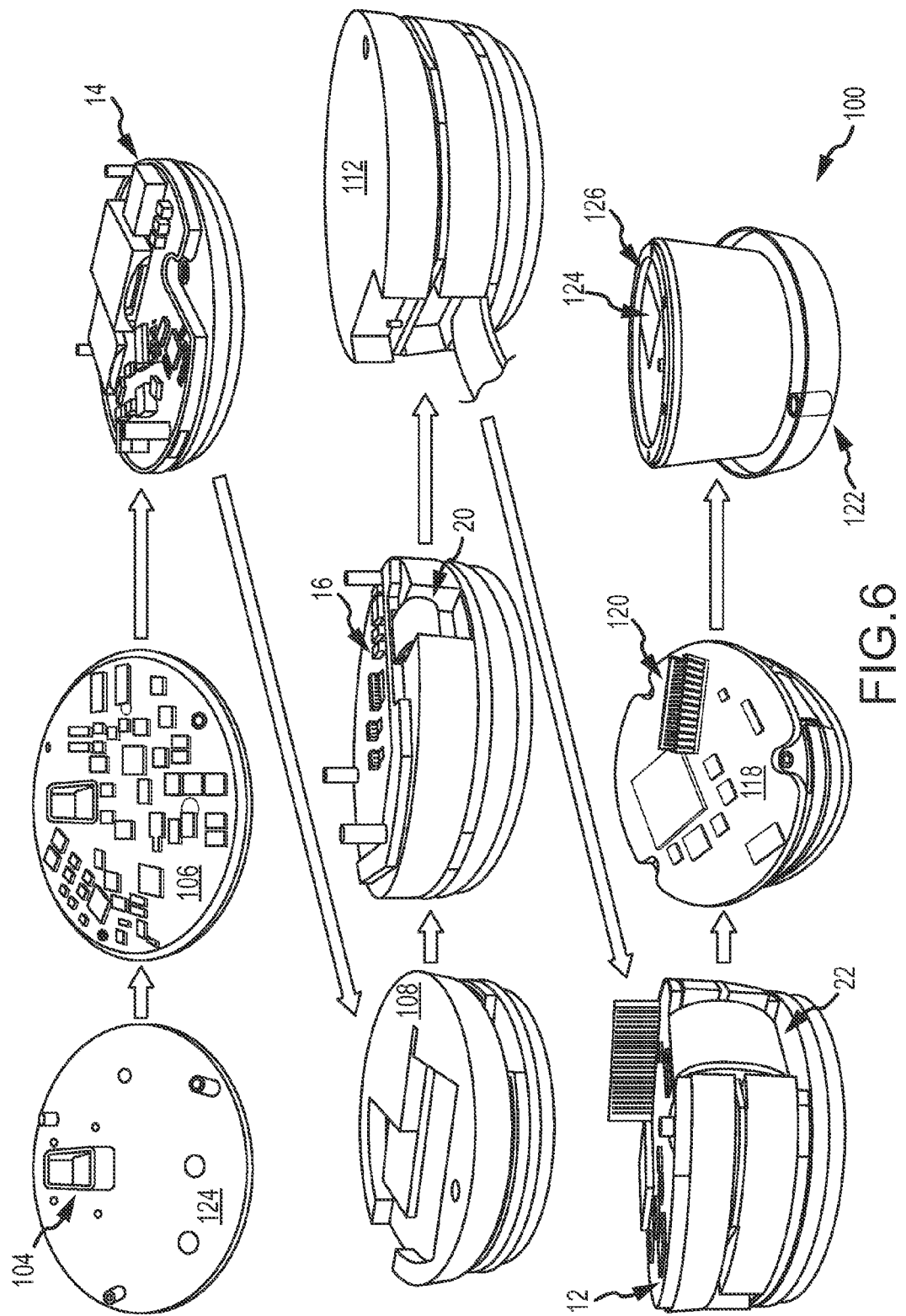
FIG. 6 is a process diagram of the assembly of an electronics package comprising alternating electronics assemblies and compliant inserts.
Figure 7:
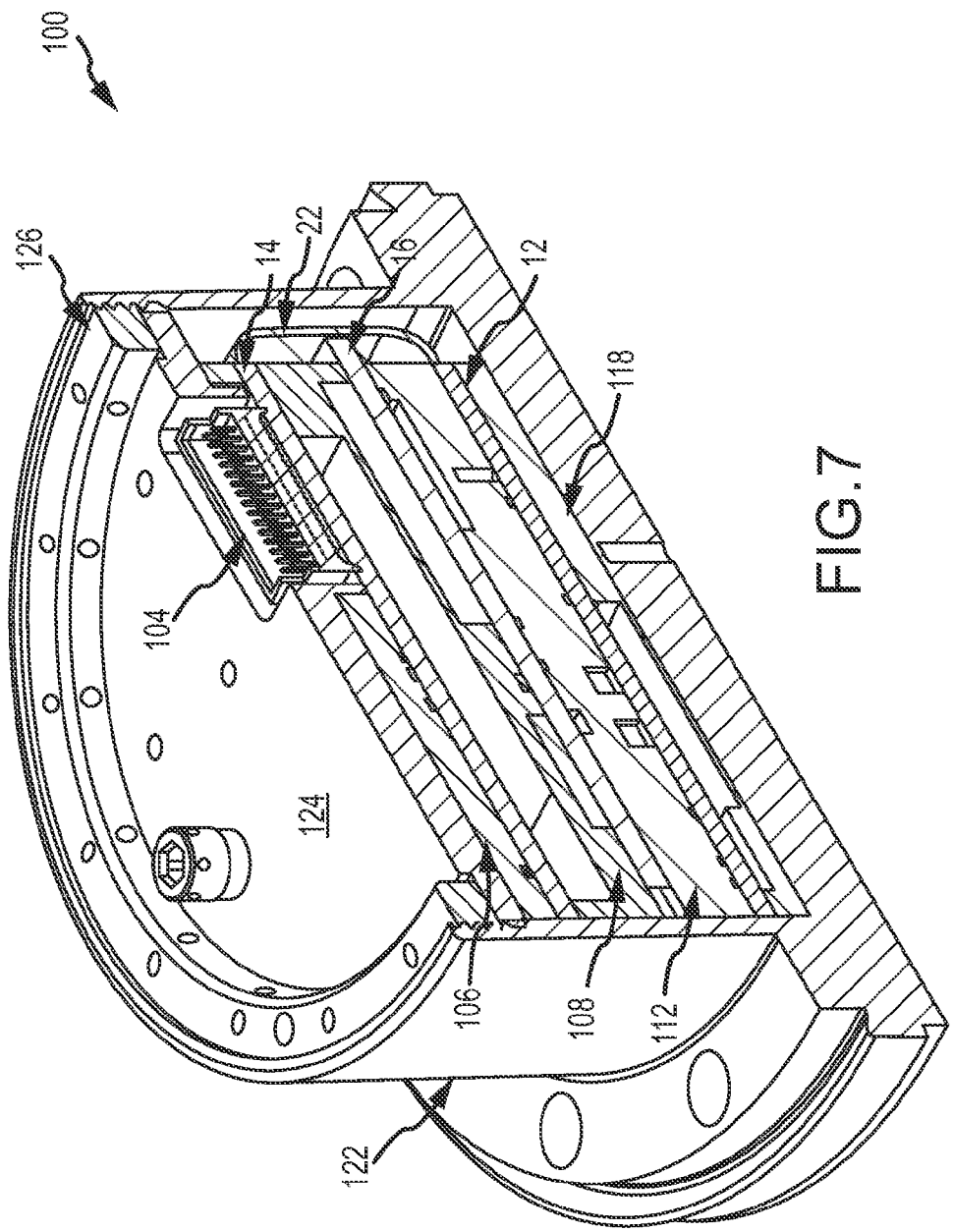
FIG. 7 is a section view of the electronics package.

As shown in FIGS. 6 and 7, the three electronics assemblies 12, 14 and 16 shown in FIG. 1 are assembled with one and two-sided compliant inserts into an electronics package 100. In this embodiment, the assemblies and inserts are stacked upside down on a lid 124 having a connector port 104 and inserted into an enclosure 122. A compliant insert 106 is placed on lid 124 so that connector port 104 extends there through. Insert 106 has a generally flat top surface to match the underside of the lid and a 3-D negative relief on its bottom surface to match the 3-D positive relief on the top surface of the first electronics assembly 14. Assembly 14 is positioned topside down on insert 106 so that its components loosely engage the cutouts in insert 106. A compliant insert 108 (similar to insert 44 detailed above) is placed topside down assembly 14. Insert 108 has a 3-D negative relief on its top surface to match the 3-D positive relief on the bottom surface of assembly 14 and a 3-D negative relief on its bottom surface to match the 3-D positive relief on the top surface of the second electronics assembly 16. Assembly 16, which is connected via inter layer flexible printed circuit 20 to assembly 14, is folded over insert 108 so that its components loosely engage the cutouts in insert 108. A compliant insert 112 is placed topside down on assembly 16. Insert 112 has a 3-D negative relief on its top surface to match the 3-D positive relief on the bottom surface of assembly 16 and a 3-D negative relief on its bottom surface to match the 3-D positive relief on the top surface of the second electronics assembly 12. Assembly 12, which is connected via inter layer flexible printed circuit 18 to assembly 14, is folded over insert 112 so that its components loosely engage the cutouts in insert 112. A final compliant insert 118 is placed topside down assembly 12. Insert 118 has a 3-D negative relief on its top surface to match the 3-D positive relief on the bottom surface of assembly 12. Insert 118 has a generally flat bottom surface with a cutout for an external connector 120. This stack is turned right-side up and placed inside housing 122 with lid 124 covering the opening in the housing. Means 126 such as a threaded ring (as shown in the figures), a clamp or bolts are used to load lid 124 to push down on and preload the stack. Preloading causes the compliant insert to absorb the variations in the assemblies due to manufacturing tolerances and minimize or eliminate any unintended air gaps.

Figure 8A:
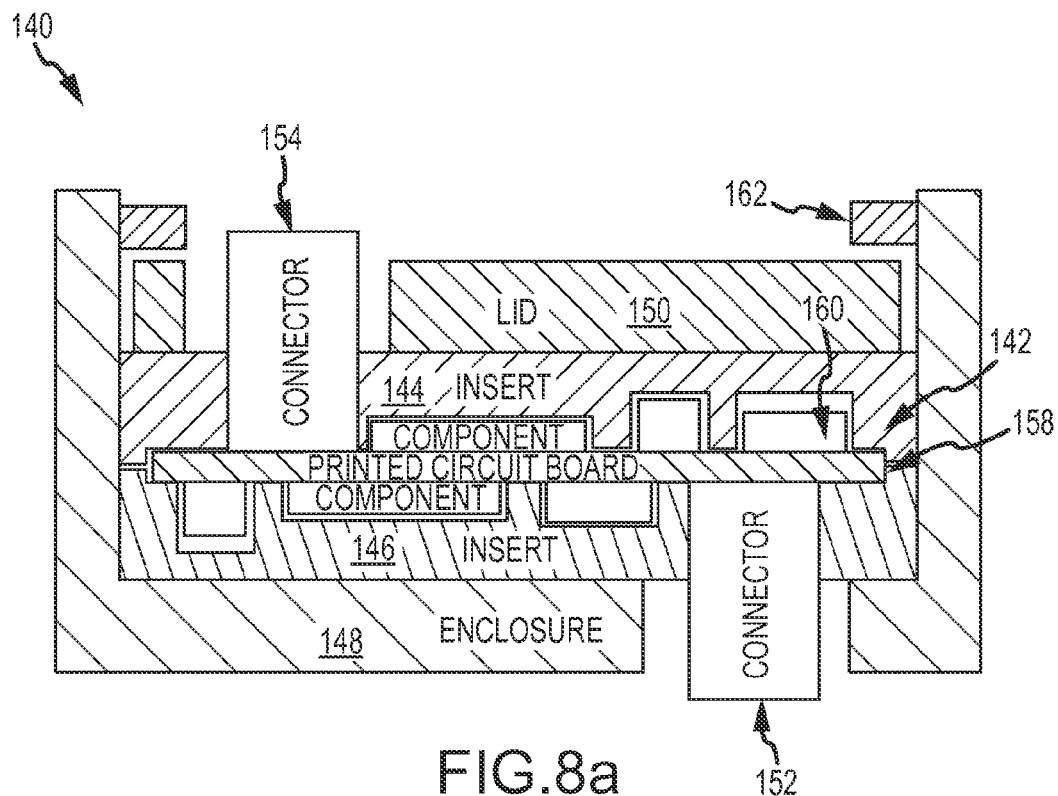
FIGS. 8a through 8c are section views of a time sequence for pre-loading the electronics package to eliminate any remaining air gaps between the insert and the electronics assembly.
Figure 8B:
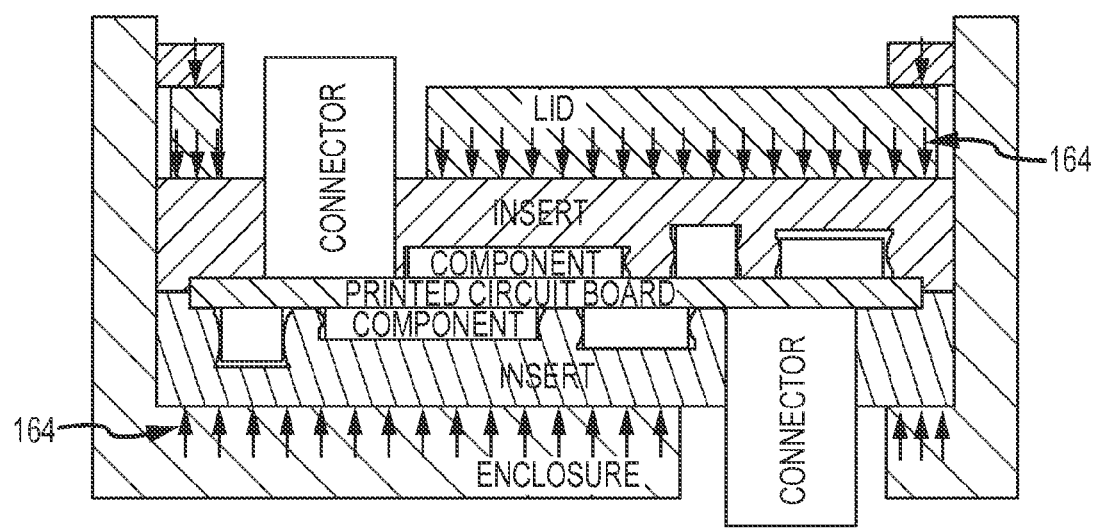
Figure 8C:
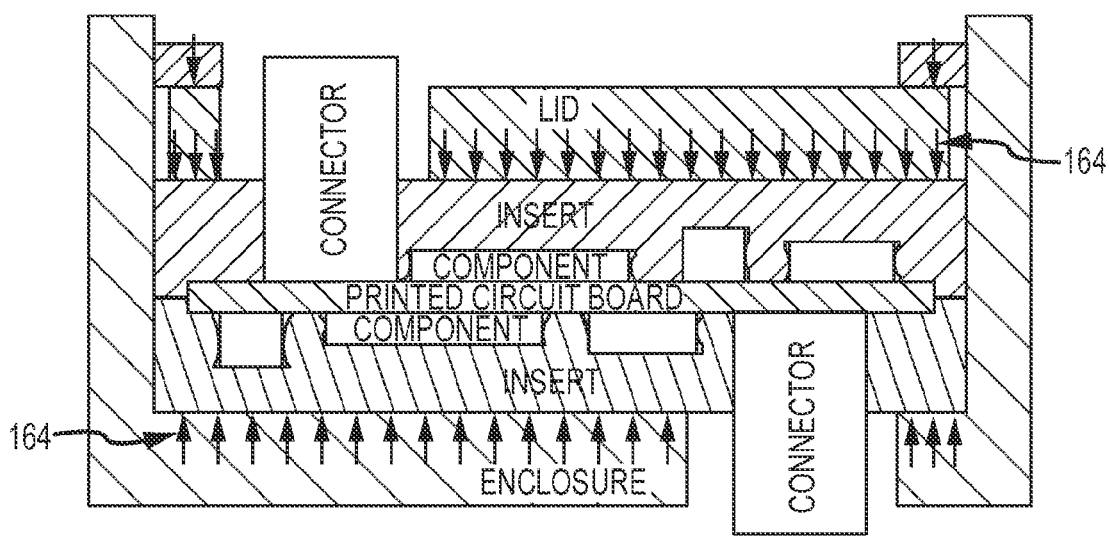

An example of the initial assembly and preloading of an electronics package 140 comprising a single two-sided electronics assembly 142 sandwiched between a pair of compliant inserts 144 and 146 is illustrated in FIGS. 8a through 8c. This stack is placed in an enclosure 148 that is covered with a lid 150. External connectors 152 and 154 pass through the bottom of the enclosure and top of the lid, respectively, to connect to the assembly's PCB 158. The two-sided assembly includes electronic components 160 on both its top and bottom surfaces. As shown in FIG. 8a, the stack has been assembled and placed inside the enclosure. In this example, components are at the nominal condition and the 3-D negative relief of both cutouts has been designed for the "maximum material condition" of the assembly i.e. the maximum positive deviation of the component height and lateral extent from the nominal geometric design. As such, the insert cutouts are a little too big and package is a loose. As shown in FIG. 8b, retaining ring 162 has been threaded to engage lid 150 and press down on the stack. This causes both lid 150 and the bottom of enclosure 148 to exert approximately uniform forces 164 on the stack. This preload compresses the compliant inserts causing them to absorb the tolerances in the components, both in height and lateral extent. Depending upon the actual position and height of individual components, some components will exhibit part of the final preload while others have not yet been loaded. As shown in FIG. 8c, retaining ring 162 has been tightened so that all of the components are preloaded. Components loaded first, either because of manufacturing variation or because the 3-D negative relief of the insert was intentionally modified, have a higher final preload than components loaded later.

Once assembled, the electronics assembly may be connected to other external systems and tested. Should testing reveal a problem with the assembly, the package can be easily disassembled. The retaining ring is unscrewed and the lid removed to extract the stack. As the compliant inserts are not bonded to the assemblies, the stack is easily disassembled to gain access to the electronics assembly. The assembly can be reworked or replaced. The stack is reassembled, placed back into the enclosure with the lid and the retaining ring is thread back into place.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. An electronics package, comprising:
a first electronics assembly comprising a plurality of electronic components mounted on a printed circuit board (PCB) that provides a first 3-D positive relief, at least a height of said components off the PCB varying within a tolerance with respect to a specified geometric design of the first electronics assembly; and
a compliant insert comprising a polymer material having a durometer of between 10 and 90 on the Shore A scale and a first 3-D negative relief of the specified geometric design of the first electronics assembly on the surface of the polymer material,
said compliant insert mated with said first electronics assembly such that the first 3-D negative relief of the polymer material engages the first 3-D positive relief of the PCB and electronic components and absorbs the height tolerances of the electronic components.

2. The compliant insert of claim 1, wherein the polymer material has a durometer of between 30 and 70 on the Shore A scale.

3. The compliant insert of claim 1, wherein the ASTM D2240-00 testing standard defines Shore A scale.

4. The compliant insert of claim 1, wherein the polymer material comprises silicone or urethane.

5. The compliant insert of claim 1, wherein said compliant insert is usable with any instance of the electronics assembly manufactured within a specified tolerance of the specified geometry design for that electronics assembly.

6. The compliant insert of claim 1, wherein the 3-D negative relief is modified to remove material volume to create an air channel in the insert.

7. The compliant insert of claim 1, wherein the insert further comprises a conductive insert within the air channel.

8. The electronics package of claim 1, wherein the insert abuts but does not bond to the electronics assembly.

9. The electronics package of claim 1,
a second electronics assembly comprising a plurality of electronic components mounted on a printed circuit board (PCB) that provides a second 3-D positive relief, at least a height of said components off the PCB varying within a tolerance with respect to a specified geometric design of the second electronics assembly;

wherein the insert comprises a second 3-D negative relief of the specified geometric design of the second electronic assembly on an opposing surface of the polymer material;

wherein said insert lies between and mated with the first and second electronics packages such that the first 3-D negative relief of the polymer material engages the first 3-D positive relief of the first electronics assembly and the second 3-D relief of the polymer material engages the second 3-D positive relief of the second electronics assembly.

10. The electronics package of claim 1, further comprising:
means to preload the package so that the compliant insert engages the PCB and electronic component of the electronics assembly.

11. The compliant insert of claim 10, wherein the first 3-D negative relief is modified to remove or add material volume to vary a nominal preload on specified electronic components.

12. The compliant insert of claim 1, wherein the 3-D negative relief is modified to remove material volume to not engage either side or top surfaces of specified electronic components.

* * * * *